United States Patent
Cox et al.

(10) Patent No.: US 6,667,244 B1
(45) Date of Patent: Dec. 23, 2003

(54) METHOD FOR ETCHING SIDEWALL POLYMER AND OTHER RESIDUES FROM THE SURFACE OF SEMICONDUCTOR DEVICES

(76) Inventors: Gerald M. Cox, 4050 Lakeside Dr., Richmond, CA (US) 94806; John Kevin Donoghue, 4050 Lakeside Dr., Richmond, CA (US) 94806; Kristel Van Baekel, 4050 Lakeside Dr., Richmond, CA (US) 94806; Chan-Yun Lee, 471 Via Vera Cruz, Fremont, CA (US) 94539

( * ) Notice: Subject to any disclaimer, the term of this patent is extended or adjusted under 35 U.S.C. 154(b) by 0 days.

(21) Appl. No.: 09/534,657

(22) Filed: Mar. 24, 2000

(51) Int. Cl.[7] .............................................. H01L 21/311
(52) U.S. Cl. ....................... 438/712; 438/706; 438/714; 438/725
(58) Field of Search .................. 438/706, 714, 438/725, 712

(56) References Cited

U.S. PATENT DOCUMENTS

| | | |
|---|---|---|
| 4,778,536 A | 10/1988 | Grebinski |
| 5,100,505 A | 3/1992 | Cathey, Jr. |
| 5,108,542 A | 4/1992 | Lin |
| 5,147,499 A | 9/1992 | Szwejkowski et al. |
| 5,160,765 A | 11/1992 | Rotman et al. |
| 5,200,361 A | 4/1993 | Onishi |
| 5,296,093 A | 3/1994 | Szwejkowski et al. |
| 5,298,112 A | 3/1994 | Hayasaka et al. |
| 5,485,754 A | 1/1996 | Harpster |
| 5,628,871 A | 5/1997 | Shinagawa |
| 5,693,147 A | 12/1997 | Ward et al. |
| 5,744,192 A | 4/1998 | Nguyen et al. |
| 5,773,201 A | 6/1998 | Fujimura et al. |
| 5,810,929 A | 9/1998 | Yuuki |
| 5,814,155 A | 9/1998 | Solis et al. |
| 5,851,302 A | 12/1998 | Solis |
| 5,882,489 A * | 3/1999 | Bersin et al. ........... 204/192.35 |
| 5,895,274 A * | 4/1999 | Lane et al. .................. 438/795 |
| 5,925,577 A * | 7/1999 | Solis ........................... 438/725 |
| 6,066,508 A * | 5/2000 | Tanabe et al. ................ 438/38 |

FOREIGN PATENT DOCUMENTS

| | | | |
|---|---|---|---|
| EP | 0304046 | 2/1989 | |
| EP | 0 666 237 A1 | 10/1993 | |
| EP | 0 878 443 A1 | 11/1998 | |
| EP | 0 940 846 A1 | 9/1999 | |
| EP | 0 957 512 A2 | 11/1999 | |
| JP | 01205425 A | 8/1989 | |
| JP | 01205425 A * | 8/1989 | .................... 21/31 |
| JP | 03185821 A | 8/1991 | |
| JP | 04171918 A | 6/1992 | |
| JP | 05335293 A | 12/1993 | |
| JP | 10055994 A | 2/1997 | |
| WO | WO 98/57366 | 12/1998 | |
| WO | WO99/26281 | 5/1999 | |

* cited by examiner

*Primary Examiner*—Nadine G. Norton
*Assistant Examiner*—Matthew Anderson
(74) *Attorney, Agent, or Firm*—Gregory Scott Smith; Gregory Smith & Associates

(57) ABSTRACT

A method for removing organic and inorganic residues or polymers from the surface of semiconductor devices, with a combination of etchant gasses including water vapor generated using a catalytic moisture generator or CMG. The water vapor is generated by introducing $O_2$ and an $H_2$ containing forming gas including hydrogen and at least one dilutant gas into the CMG. The water vapor from the CMG is introduced into a reaction chamber with other etchant gasses to treat the surface of a semiconductor device placed within. The flow rate of water vapor out of the CMG and into the reaction chamber may be controlled by controlling the flow rate of the $H_2$ containing forming gas and the flow rate of the $O_2$ gas into the CMG.

2 Claims, 1 Drawing Sheet

METHOD FOR ETCHING SIDEWALL POLYMER AND OTHER RESIDUES FROM THE SURFACE OF SEMICONDUCTOR DEVICES

FIELD OF THE INVENTION

The invention relates to processes used in integrated circuit fabrication for removing photoresist and organic and inorganic residues or polymers from the surface of semiconductor devices, and more particularly to processes for removing photoresist and polymers or residues from the surface of integrated circuit devices with a combination of gasses, including water vapor.

BACKGROUND OF THE INVENTION

Conventional fabrication of an integrated circuit device typically involves placing numerous device structures, such as MOFSETs, bipolar transistors, and doped contact regions, on a single monolithic substrate. The device structures are then electrically interconnected with horizontal conductive lines or structures formed in layers and vertical conductive structures called vias between layers, with dielectric material disposed between the conductive structures so as to implement desired circuit function.

During the fabrication of semiconductor devices, it is typical to perform a series of steps resulting in the etching of via holes, trenches, and other structures into one or more layers. After this step, it is necessary to remove the photoresist in a process typically referred to as ashing. Furthermore, a residue, often called a sidewall polymer or a veil, is typically formed on the walls of the features during these process steps, and the residues can include both organic and inorganic components. It is well known in the art that the presence of such residues and polymers affects the reliability of the semiconductor devices. One of the major challenges facing current manufacturing processes is the requirement for complete removal of such residues.

There are many known methods for ashing the resist and removing such residues. Currently preferred methods frequently use fluorine containing gasses such as $CF_4$, $NF_3$, and $SF_6$, usually in the presence of $O_2$, to facilitate the removal of the residues. However, the fluorine based etchants also attack the metal alloy layers and the dielectric oxide layers present on the semiconductor device. It is known in the art that the addition of water vapor to the etchant gasses, particularly to etchant gasses comprising $CF_4$ and $O_2$, significantly improves the selectivity of the process, causing the etch rate of oxides and metal layers to drop significantly. A number of etching or stripping methods have been developed using water vapor.

Commercially available water vapor delivery systems for use in semiconductor fabrication currently utilizes liquid water for the water vapor source. Generally, the liquid water is heated in a vessel, and vapors are drawn off through a heated mass flow controller and a heated series of valves and lines to the reaction chamber. However, the use of liquid water as a water vapor source has presented a number of difficulties. For example, if the vessel is not at an adequate temperature, there may not be enough vapor for the reaction, and an adequate heat-up time, often several hours, must be allowed. Water, especially very pure deionized water, has excellent solvating properties, and thus tends to acquire organic and inorganic contaminants from a variety of sources including the pipes, fittings, and adhesives in the water delivery lines of the equipment in which the water is used. Also, especially in stagnant regions, water may contain microorganisms, which can be a continual source of contaminants. Typically, the flow of water vapor is controlled by the use of special, heated mass flow controllers that operate by sensing the pressure before and after the regulating valve, and then adjust the flow by opening or closing the valve based on the pressure difference. These mass flow controllers are sensitive to their absolute inlet and outlet pressures, and will not operate correctly if they are not within a narrow pressure tolerance. This makes water vapor difficult to control, especially when used with other non-condensable gasses that may backstream into the mass flow controller. Furthermore, the water vapor may cool and form microscopic droplets, which can contaminate a wafer's surface. Lastly, liquid water source water vapor systems require a vapor bypass assembly to keep the vapor flowing continuously, even when the water vapor is not being used in the reaction cahmber.

What is needed is a method for removing photoresist and other polymers or residues that avoids the disadvantages of the prior art.

SUMMARY OF THE INVENTION

The invention is a novel processes used in integrated circuit fabrication for removing photoresist and or post-etch polymers or residues from the surface of integrated circuit devices with a combination of gasses, including water vapor created using a catalytic moisture generator.

To address the problems commonly experienced with current semiconductor fabrication processes using water vapor derived from liquid water based water, a novel method has been developed. In the method of the invention, water vapor is formed by the reaction of hydrogen and oxygen in a catalytic moisture generator. The hydrogen is carried in a mixture commonly called forming gas, in which the hydrogen is heavily diluted with an inert gas, such as helium or nitrogen, so that it is less flammable. Oxygen is added to the forming gas in the presence of the catalyst to form the water vapor. The use of this type of water vapor source is novel to process equipment used in the semiconductor industry.

In one embodiment, the method of the invention is a method for removing photoresist and organic and inorganic residues from the surface of semiconductor devices comprising the steps of: (a) placing a semiconductor device, having a residue formed thereon, into a reaction chamber, (b) introducing etchant gasses into the reaction chamber, wherein the etchant gasses preferably include at least one fluorine containing gas, and water vapor generated by introducing $O_2$ and an $H_2$ containing forming gas into a catalytic moisture generator to create the water vapor, (c) applying energy to the etchant gasses to generate a plasma, and (d) exposing the semiconductor device in the reaction chamber to the plasma for a selected period of time. In this method, the fluorine containing gas may comprise one or more of $CF_4$, $NF_3$, and $SF_6$. It is preferable that, the hydrogen containing forming gas includes a helium or argon dilutant. The hydrogen preferably makes up 1% to 25% of the forming gas, and more preferably 4% to 6% of the forming gas. Generally, the $O_2$ and $H_2$ are combined in stoichiometric amounts, however, in alternate methods the relative quantities of each can be varied. In some embodiments of the method, the etchant gas further includes $N_2$. The water vapor can be introduced together with, or separately from, the other etchant gasses.

A second embodiment of the method of the invention is a method for controlling the amount of water vapor introduced to a reaction chamber during a semiconductor device fabrication process comprising the steps of: (a) providing a reaction chamber having a catalytic moisture generator in gas communication therewith, (b) placing a semiconductor device into the reaction chamber, (c) introducing etchant gasses into the reaction chamber, wherein the etchant gasses include water vapor generated by introducing $O_2$, and a forming gas including $H_2$ and at least one dilutant gas, into a catalytic moisture generator, and (c) controlling the flow rate of water vapor into the reaction chamber by controlling the flow rate of the $H_2$ containing forming gas and the flow rate of the $O_2$ gas into the catalytic moisture generator. In some embodiments of this method, the $H_2$ comprises between 1% and 20% of the volume of the hydrogen containing forming gas, but more preferably the $H_2$ comprises between 4% and 6% of the hydrogen containing forming gas. In other embodiments, the hydrogen containing forming gas further includes one or more of helium, argon, or nitrogen. Preferably the $H_2$ and the $O_2$ are introduced into the catalytic moisture generator in stoichiometric quantities, so that an output of the catalytic moisture generator includes insignificant quantities of any gasses other than water vapor and a dilutant gas. However, in some embodiments of the method it may be preferable to introduce excess hydrogen into the catalytic moisture generator so that the resulting output of the catalytic moisture generator includes hydrogen, water vapor, and a dilutant gas. In still other embodiments, it may be preferable to introduce excess oxygen into the catalytic moisture generator so that the resulting output of the catalytic moisture generator includes oxygen, water vapor, and a dilutant gas.

DETAILED DESCRIPTION OF THE INVENTION

Figure 1:
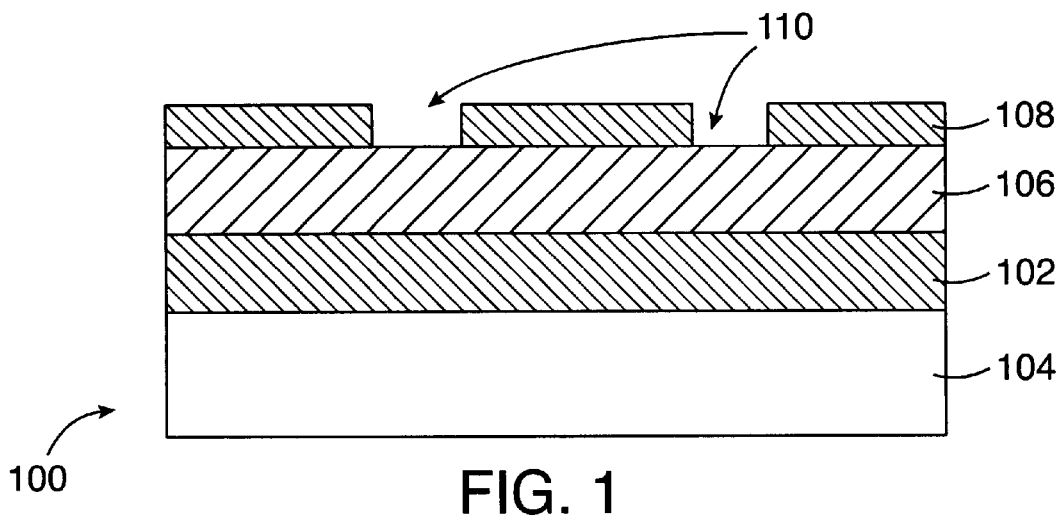
FIG. 1 is a cutaway side view of a semiconductor device with a metal layer disposed over underlying layers, a dielectric layer disposed over the metal layer, and a layer of photoresist disposed over the dielectric layer with apertures formed in the photoresist to define areas where the dielectric will be etched.

The invention is a novel processes used in integrated circuit fabrication for removing photoresist and post-etch polymers or residues from the surface of integrated circuit devices with a combination of gasses, including water vapor created using a catalytic moisture generator.

In the methods of the invention described further below, reactive species derived from etchant gasses are generated in a plasma, and these species diffuse to the resist and/or post-etch polymers on the semiconductor device where the reactive species chemically react to produce desired chemical changes in the nature of the resist or residues. Typically the reaction removes the photoresist and residues by creating volatile by-products that are de-sorbed from the surface of the semiconductor device. However, the desired reaction could instead result in a residue that is prepared for removal in a subsequent process step. It is known that the selectivity for removal of residues when using fluorine containing gasses such as $CF_4$, $NF_3$, and $SF_6$ can be improved by adding water vapor, which appears to inhibit the etching of the conductive metal layers and the dielectric oxide layers. The novel method of the present invention comprehends using water vapor created using a catalytic moisture generator.

The method of the invention may be implemented with any suitable plasma stripping or etching system, and is not limited to the particular configurations that may be disclosed herein. The assembly of such systems is well known, and many such assemblies exist in a variety of configurations. The exact configuration of the system may be varied as required, and the details of the particular system used will depend on the parameters of the process that must be controlled, and the specific application of the system. The primary necessity for performing the method of the invention is the inclusion of a catalytic moisture generator to provide water vapor.

Plasma stripping and etching systems generally comprise a number of interconnected components including (a) an etching or stripping chamber, hereafter referred to as a reaction chamber, that can be evacuated to reduce the gas pressures therein, (b) a pumping system for establishing and maintaining the desired pressure, (c) various pressure gauges to monitor the pressure in the chamber, (d) apparatus allowing the pressure in the chamber and the flow rate of gasses into the chamber to be controlled independently, (e) a power supply, (f) gas handling apparatus for metering and controlling the flow of reactant gasses, including the water vapor, and (g) one or more means for creating a plasma and for maintaining the plasma.

In general, one or more process gasses are introduced into the reaction chamber of the stripping or etching system from one or more gas sources through an inlet pipe. In a dual energy source system, typically, a microwave source preferably at the inlet pipe, causes a microwave plasma to be formed at the inlet pipe, thus discharging a reactive gas with a high concentration of free radicals. The gas passes through openings in a top electrode of an RF energy source mounted above a wafer, where additional RF energy is applied to the plasma. Under appropriate conditions, the reactive gas can decompose and remove unwanted residues by converting the residues to volatile gasses. A vacuum draws the gasses away through an exhaust tube, and also maintains the pressure in the chamber within a desired range. In addition to the elements listed above, the system in which the method of the invention is used must include a catalytic moisture generator in gas communication with the reaction chamber. Generally the catalytic moisture generators include gas inlet pipes to carry the hydrogen and oxygen, coupled to a small chamber containing a catalyst material such as platinum or palladium, and an outlet pipe to carry the resulting water vapor to the reaction chamber of the stripper or etcher. Preferred embodiments the catalytic moisture generator also include temperature sensors and gages and valves for controlling the rate of flow of the hydrogen and oxygen. Generally it is preferred that the effluent flow of water vapor be controlled by monitoring and controlling the inflow of hydrogen and oxygen. Many commercially available catalytic moisture generator's may be useable, however, the currently preferred catalytic moisture generator is currently model CMG-100 available from UOP, LLC. in Illinois. This CMG includes a stainless steel casing and a palladium zeolite catalyst.

The novel use of water vapor created using a catalytic moisture generator in the method of the invention has many benefits over previous stripping methods that include the use of water vapor obtained from other sources, including liquid water sources. For example, gasses typically do not have the solvating powers of liquids, and so they do not readily carry inorganic/organic contaminants. Thus, the use of a catalytic moisture generator system can avoid the problems associated with deionized water acquiring contaminants from the water storage containers and piping of the systems utilizing liquid water as the water vapor source. Also, anhydrous gasses do not support microbial life, and so avoid the problem of contamination by these sources, which may arise in other kinds of water vapor delivery systems. Furthermore, because there is no water vessel to heat, the amount of time necessary to start the system from a cold start is much less. Current water vapor delivery systems use special heated mass flow controller's to control the flow of the water vapor. The use of mass flow controller's to measure the flow of condensable gasses can be difficult and is prone to inaccuracy. The use of a catalytic moisture generator allows the water vapor flow to be controlled by monitoring the inflow of the non-condensable gas pre-cursors into the catalytic moisture generator, which may be easily and accurately controlled with conventional gas mass flow controllers. Furthermore, water vapor from a catalytic moisture generator can be delivered at a higher pressure, and can be used with other non-condensable gasses, as there will not be significant backstreaming into the mass flow controller, as can occur with the use of liquid source water vapor delivery systems. In addition, catalytic moisture generator water vapor delivery systems are typically inherently much simpler and significantly more dependable than liquid source water vapor systems because the catalytic systems typically require less space, fewer valves and supporting hardware, and less software/circuitry to control.

Figure 2:
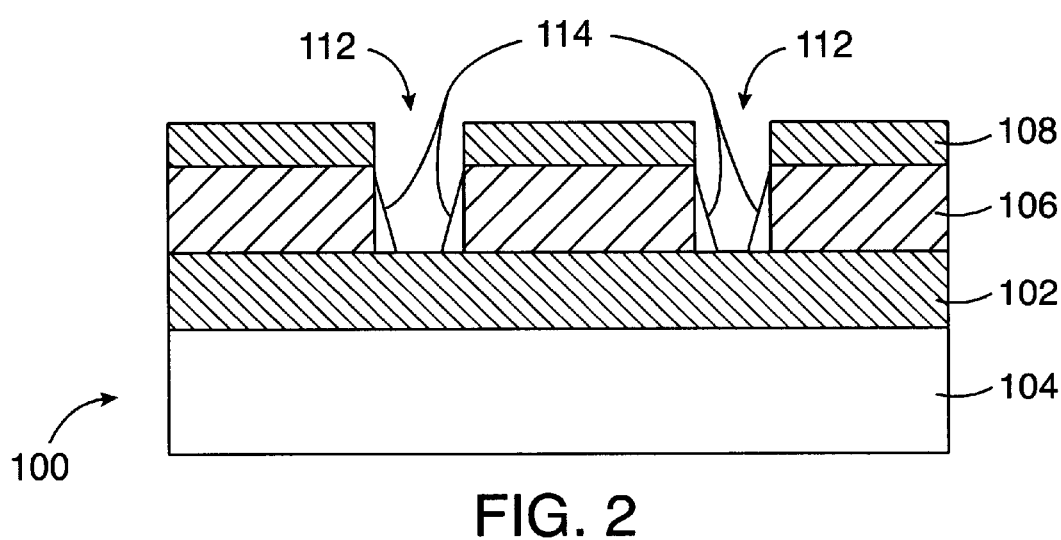
FIG. 2 is a cutaway side view of the semiconductor device of FIG. 1 after the dielectric has been etched.
Figure 3:
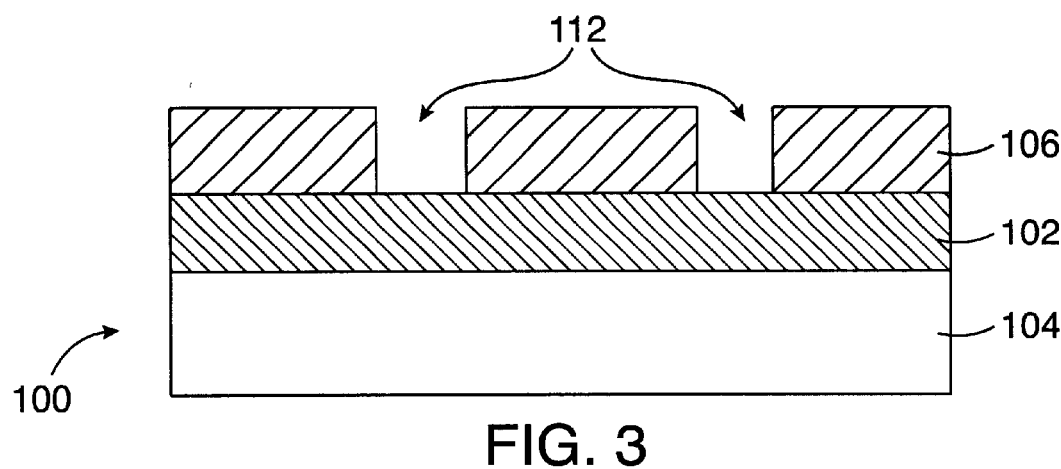
FIG. 3 is a cutaway side view of the semiconductor device of FIG. 2 after the method of the invention has been applied to remove the photoresist layer and any sidewall polymers or residues.

FIGS. 1 through 3 illustrate one application or example of use of the method of the invention in a process for forming via holes in a layer of dielectric material deposited over a metal layer in which conductive lines have been formed. FIG. 1, shows a semiconductor device 100 on which known methods are used to form conductive lines in a metal layer 102 disposed over the underlying layers 104. The metal layer 102 typically actually comprises several layers of different metals or alloys including barrier layers, seed layers, etc. A dielectric layer 106 is then formed over the metal layer 102. Any desired dielectric material may be used, and the particular dielectric material used is not critical to the invention. The method of applying the dielectric layer 106 is also not critical to the invention, and examples of acceptable methods for depositing the dielectric layer 106 include known chemical vapor deposition (CVD) methods, physical vapor deposition (PVD) methods, and spin-on deposition methods. Then, using known methods, the dielectric layer 106 is planarized, and coated with a photoresist mask. The dielectric layer 106 typically comprises a number of layers which may include several types of dielectrics, and silicon oxide and or silicon nitride caps or barriers.

Conventional spin-on methods are preferred for forming the photoresist layer 108, however, other methods of applying the photoresist 108 may be acceptable. To enhance the photo-lithographic process, anti-reflective coatings (ARC) may be deposited prior to the photoresist 108. The photoresist 108 is cured in a conventional manner that depends on the particular photoresist material chosen. Typically, the photoresist 108 is exposed through a mask to an agent such as UV light, electron beam, or X-rays. Then, the photoresist 108 is developed to produce regions or gaps 110 where the photoresist 108 has been removed to allow etching materials access to the underlying dielectric layer 106, as is seen in FIG. 1

Referring to FIG. 2, the dielectric layer 106 underlying the photoresist layer 108 is etched through the gaps 110. This results in the formation of via holes 112 to receive conductive material that will form vias. Typically, certain residues remain after ashing, including sidewall polymers, or via veils 114, as shown. The particular etching method is not critical to the invention. Generally there is some over etching to insure that quality vias have been formed, and this results in inorganic material being incorporated into the via veils 114.

Application of the methods of the invention results in the semiconductor device 100 of FIG. 3, which shows the photoresist 108 and the via veils 114 removed. Although a conventional via etching process has been shown, the method of the invention may be used in virtually any other semiconductor manufacturing process using water vapor. The methods of the invention will now be described.

In one embodiment, the method of the invention is a method for removing photoresist and organic and inorganic residues from the surface of semiconductor devices comprising the steps of: (a) placing a semiconductor device, having a residue formed thereon, into a reaction chamber, (b) introducing etchant gasses into the reaction chamber, wherein the etchant gasses preferably include at least one fluorine containing gas, and water vapor generated by introducing $O_2$ and an $H_2$ containing forming gas into a catalytic moisture generator to create the water vapor, (c) applying energy to the etchant gasses to generate a plasma, and (d) exposing the semiconductor device in the reaction chamber to the plasma for a selected period of time. In this method, the fluorine containing gas may comprise one or more of $CF_4$, $NF_3$, and $SF_6$. It is preferable that, the hydrogen containing forming gas includes a helium, argon, or nitrogen dilutant. The hydrogen preferably makes up 1% to 25%, by volume, of the forming gas, and more preferably 4% to 6% of the forming gas. Generally, the $O_2$ and $H_2$ are combined in stoichiometric amounts, however, in alternate methods the relative quantities of each can be varied. In some embodiments of the method, the etchant gas further includes $N_2$. The water vapor may be introduced in to the reaction chamber together with, or separately from, the other etchant gasses.

A second embodiment of the method of the invention is a method for controlling the amount of water vapor introduced into a reaction chamber during a semiconductor device fabrication process comprising the steps of: (a) providing a reaction chamber with a catalytic moisture generator in gas communication therewith, (b) placing a semiconductor device into the reaction chamber, (c) introducing etchant gasses into the reaction chamber, wherein the etchant gasses include water vapor generated by introducing $O_2$, and a forming gas including $H_2$ and at least one dilutant gas, into a catalytic moisture generator, and (c) controlling the flow rate of water vapor into the reaction chamber by controlling the flow rate of the $H_2$ containing forming gas and the flow rate of the $O_2$ gas into the catalytic moisture generator. In some embodiments of this method, the $H_2$ comprises between 1% and 20%, by volume, of the hydrogen containing forming gas, but more preferably the $H_2$ comprises between 4% and 6% of the hydrogen containing forming gas. In other embodiments, the hydrogen containing forming gas further includes one or more of helium, argon, or nitrogen. Preferably the $H_2$ and the $O_2$ are introduced into the catalytic moisture generator in stoichiometric quantities, so that an output of the catalytic moisture generator includes water vapor and a dilutant gas. For example, if a forming gas that had 4% hydrogen in helium was used in the presence of a stoichiometric amount of oxygen, then the effluent from the catalytic moisture generator is 4% water vapor and the remaining 96% is helium. However, in some embodiments of the method it may be preferable to introduce excess hydrogen into the catalytic moisture generator so that the resulting output of the catalytic moisture generator includes hydrogen, water vapor, and the dilutant gas. In other embodiments, it may be preferable to introduce excess oxygen into the catalytic moisture generator so that the resulting output of the catalytic moisture generator includes oxygen, water vapor, and the dilutant gas.

The forming gas is defined here as a gas mixture that contains hydrogen in an inert (non-flammable) gas, such as argon, helium, or nitrogen. Forming gas allows the use of hydrogen as a process gas, but with a reduced flammable hazard. The forming gas can be made in any percentage hydrogen content that one desires. Hydrogen content of 15% or lower are common. A hydrogen content of about 5% is preferred.

When $H_2$ containing forming gas is used together with oxygen in a catalytic moisture generator to make water vapor, the reaction is exothermic. At flows, near or above 15 liter per minute, the temperature of a typical catalytic moisture generator casing can rise from 100 to 300 C. In addition, the higher the concentration of hydrogen in the forming gas, the hotter the reaction. For reasons of safety, the hydrogen containing forming gas preferably comprises less than 6% $H_2$.

The word "inert" when applied to components of the forming gas refers only to the gasses flammability. Even though the "inert" portion of the forming gas is inert when considered for flammability, or reaction within the catalytic moisture generator, it may not necessarily be inert when reacting with the surface of the semiconductor device in the reaction chamber. As the inert portion of the gas passes downstream, it too is part of the plasma in the reactor chamber, and the results of the method may be affected by the "inert" portion.

In the method of the invention it is generally preferred that no additional amount of inert gas is introduced into the process stream above and beyond the amount that enters the catalytic moisture generator, however, there are exceptions. For example, under some circumstances, the addition of $N_2$ to a primarily helium or argon forming gas may show improved residue removal results.

The methods described above are disclosed in more detail below by way of example. These processes may include several steps, the order of which may vary from one situation to another.

EXAMPLE 1

The first example discloses the method of the invention used in a via veil removal process in a dual energy source system, with a downstream microwave energy source, and an RF parallel plate reactor design. The platen on which the wafer sets, is temperature controlled by a closed loop fluid recirculator so that the usual temperatures are 15 to 80 degrees C, with water, although higher or lower temperatures are possible with other fluids. The preferred process variables are as follows:

(1) The reaction chamber gas pressure is preferably between 10–800 mtorr, and more preferably 100–360 mtorr.
(2) The RF power level is preferably from 20 to 800 watts, and more preferably 100–300 watts.
(3) The Microwave power level is preferably 0 to 5,000 watts, and more preferably 0 to 3,000 watts.
(4) The chuck temperature is preferably 15 to 45 degrees centigrade, and more preferably 20 to 30 degrees centigrade.
(5) The total flow of etchant gasses is preferably between 120 and 15,000 sccm, and more preferably between 250 and 7,500 sccm.
(6) The water vapor flow is preferably between 5 and 800 sccm, and more preferably 15 to 400 sccm. The water vapor is defined as an etchant gas, and therefore the water vapor flow cannot exceed the total flow.
(7) The other gasses making up the balance of the total flow will typically but not always comprise at least 1% of a fluorine source gas, or oxygen, or both. With that limitation in mind, the preferred ranges are as follows:
  (i) Either helium or argon or a combination of both comprise 40% to 98% of the total flow, and more preferably 50 to 98% of the total flow.
  (ii) A fluorine source gas such as $CF_4$, $NF_3$, or other fluorine source gas preferably comprise 0% to 20% of the total flow, and more preferably 0% to 10% of the total flow.
  (iii) $H_2$ flow preferably comprises 0% to 20% of the total flow, and more preferably 0% to 10% of the total flow.
  (iv) $O_2$ flow preferably comprises 0% to 20% of the total flow, and more preferably 0% to 10% of the total flow.
  (v) N2, when used as a forming gas dilutant, preferably comprises 40% to 98% of the total flow, and more preferably 50% to 98% of the total flow. (vi) N2, when added to a helium or argon containing forming gas as a passivant, preferably comprises 0% to 40% of the total flow, and more preferably 0% to 30% of the total flow.

EXAMPLE 2

The second example discloses the method of the invention used in implant resist removal in a system as described above. The preferred process variables are as follows:

(1) The reaction chamber gas pressure is preferably between 200–800 mtorr, and more preferably 300–500 mtorr.
(2) The RF power level is preferably from 0 to 400 watts.
(3) The Microwave power level is preferably 0 to 5,000 watts.
(4) The chuck temperature is preferably 25 to 50 degrees centigrade
(5) The total flow of etchant gasses is preferably between 500 and 1,500 sccm.
(6) The water vapor flow is preferably between 1% and 8% by volume of the total flow, and more preferably between 3% and 6%.
(7) The other gasses making up the balance of the total flow will typically, but not always, comprise at least 1% of a fluorine source gas, oxygen, or both. With that limitation in mind, the preferred ranges are as follows:
  (i) Either helium or argon or a combination of both comprise 82% to 96% of the total flow.
  (ii) A fluorine source gas such as $CF_4$, $NF_3$, or other fluorine source gas preferably comprise 0% to 10% of the total flow.
  (iii) $H_2$ flow preferably comprises 0% to 5% of the total flow.
  (iv) $O_2$ flow preferably comprises 0% to 5% of the total flow.

EXAMPLE 3

The third example discloses the method of the invention used in implant resist removal in a system including a downstream high-temperature microwave plasma chamber. The platen normally operates at temperatures from 100 to 250 C, although there are special adaptations that allow the temperature of the platen to range from room temperature to 120 C. The preferred process variables are as follows:

(1) The reaction chamber gas pressure is preferably between 600–1600 mtorr, and more preferably 900–1500 mtorr.

(2) The Microwave power level is preferably 1,000 to 5,000 watts.

(3) The chuck temperature is preferably 100 to 250 degrees centigrade.

(4) The total flow of etchant gasses is preferably between 4,000 and 8,000 sccm.

(5) The water vapor flow is preferably between 1% and 8% by volume of the total flow, and more preferably between 3% and 6%.

(6) The other gasses making up the balance of the total flow will typically, but not always, comprise at least 1% of a fluorine source gas, oxygen, or both. With that limitation in mind, the preferred ranges are as follows:
  (i) Either helium or argon or a combination of both comprise 20% to 96% of the total flow.
  (ii) A fluorine source gas such as $CF_4$, $NF_3$, or other fluorine source gas preferably comprise 25% to 90% of the total flow.
  (iii) $O_2$ flow preferably comprises 0% to 5% of the total flow.

To those skilled in the art, many changes and modifications will be readily apparent from the consideration of the foregoing description of a preferred embodiment without departure from the spirit of the present invention; the scope thereof being more particularly pointed out by the following claims. For example, it is possible to integrate the process steps of the invention in integrated circuit fabrication processes other than those discussed herein. The description herein and the disclosures hereof are by way of illustration only and should not be construed as limiting the scope of the present invention which is more particularly pointed out by the following claims.

What is claimed is:

1. A method for removing organic and inorganic residues from the surface of a semiconductor device, the method comprising:

providing a reaction chamber containing a semiconductor device with a residue formed thereon, introducing $O_2$ and a forming gas having an $H_2$ component into a catalytic moisture generator to create water vapor, transporting the water vapor to the reaction chamber, transporting etchant gases to the reaction chamber, exposing the water vapor and etchant gases to a microwave energy source as the water vapor and etchant gases are being transported to the reaction chamber, introducing the water vapor and etchant gases into the reaction chamber, applying $R_F$ energy to the etchant gases and water vapor to generate a plasma, and in the absence of fluorine, exposing the semiconductor device positioned within the reaction chamber to the plasma for a period of time sufficient for removal of the organic and inorganic residues from the surface of the semiconductor device.

2. A method for removing organic and inorganic residues from the surface of a semiconductor device, the method comprising:

providing a reaction chamber containing a semiconductor device with a residue formed thereon, introducing $O_2$ and a forming gas having an $H_2$ component into a catalytic moisture generator to create water vapor, transporting the water vapor to a reaction chamber, controlling a rate of flow of the water vapor by adjusting the rate of flow of the $O_2$ and forming gas having an $H_2$ component into a catalytic moisture generator exposing the water vapor to a microwave energy source as the water vapor is transported to the reaction chamber, transporting etchant gases to the reaction chamber, exposing the etchant gases to a microwave energy source as etchant gases are transported to the reaction chamber, introducing the etchant gases into the reaction chamber, separately introducing the water vapor into the reaction chamber, applying $R_F$ energy to the etchant gases and water vapor to generate a plasma, and in the absence of fluorine, exposing a semiconductor device positioned within the reaction chamber to the plasma for a period of time sufficient for removal of the organic and inorganic residues from the surface of the semiconductor device.

* * * * *